(12) United States Patent
Kemna

(10) Patent No.: US 6,819,175 B2
(45) Date of Patent: Nov. 16, 2004

(54) FEED FORWARD AMPLIFYING CIRCUIT

(75) Inventor: Gerard Kemna, GV Enschede (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/482,275

(22) PCT Filed: Jun. 20, 2002

(86) PCT No.: PCT/SE02/01238

§ 371 (c)(1),
(2), (4) Date: Dec. 29, 2003

(87) PCT Pub. No.: WO03/009467

PCT Pub. Date: Jan. 30, 2003

(65) Prior Publication Data

US 2004/0189384 A1 Sep. 30, 2004

(30) Foreign Application Priority Data

Jun. 29, 2001 (SE) ............................... 0102345

(51) Int. Cl.[7] ............................................. H03F 1/00
(52) U.S. Cl. ..................................... 330/151; 330/149
(58) Field of Search ............................. 330/151, 149; 375/297; 455/63

(56) References Cited

U.S. PATENT DOCUMENTS 5,850,162 A * 12/1998 Danielsons ................. 330/149

6,091,296 A       7/2000 Rha
6,275,105 B1 *   8/2001 Ghannouchi et al. ........ 330/151
6,424,214 B2 *   7/2002 Sera et al. .................... 330/151

FOREIGN PATENT DOCUMENTS

WO       00/59141 A1    10/2000
WO       01/06640 A1     1/2001

OTHER PUBLICATIONS

International Serach Report mailed Oct. 10, 2002 in corresponding PCT application No. PCT/SE02/01238.

International Preliminary Examination Report mailed Apr. 2, 2003 in corresponding PCT Application No. PCT/SE02/01238.

* cited by examiner

Primary Examiner—Henry Choe
(74) Attorney, Agent, or Firm—Nixon & Vanderhye, P.C.

(57) ABSTRACT

The present invention pertains to a feed forward amplifying circuit (1) comprising signal delay compensation equipment. The signal delay compensation equipment includes one or more variable signal delay elements (9a,9b). The variable signal delay element(s) includes a plurality of signal delay components (Dk) and switching circuitry (15a,15b;15.1a, 15.1b) providing a possibility of introducing at least one signal delay components, selected from the plurality of signal delay components, into a signal delay path. A tuning of the timing compensation becomes easy with the variable signal delay element(s), thus making the feed forward amplifying circuit (1) more suited for production on an industrial scale.

11 Claims, 1 Drawing Sheet

FEED FORWARD AMPLIFYING CIRCUIT

This the U.S. National phase of international application PCT/SEO2/01238 filed in English on 20 Jun. 2002 which designates the U.S. PCT/SE02/01238 claims priority of SE Application No. 0102345-6 filed 29 Jun. 2001. The entire contents of these applications are incorporated herein by reference.

TECHNICAL FIELD OF THE INVENTION

The present invention pertains to the field of feed forward amplifying circuits, and particularly to feed forward amplifying circuits having signal delay compensation.

BACKGROUND AND RELATED ART

A feed forward amplifying circuit is one form of amplifying circuit which employs linearisation of an amplifier which operates in a non-linear mode. The feed forward amplifying circuit is used in many technical applications, such as radio applications (e.g. high frequency military communication equipment, cellular radio communication systems satellite systems etc) or cable TV applications. The basic design of the feed forward amplifying circuit is fairy simple (first described in 1927 by H. S. Black of Bell Telephone Laboratories). The feed forward amplifying circuit includes a first branch with a main amplifier operating in a non-linear (near-linear) mode. A second (feed forward) branch is connected to the first branch in order to linearise the operation of the circuit. The linearisation takes place in two steps. In a first step, an error signal, which is indicative of distortion generated by the main amplifier, is generated on the basis of an input signal to the feed forward amplifying circuit and an output signal from the main amplifier. In a second step, the error signal is amplified by (linear) amplifying means arranged in the second branch and combined with the output signal from the main amplifier in a manner which eliminates the distortion from said output signal. Consequently, only a linear amplification of the input signal remains.

The electronics (e.g. the main amplifier) in the first branch as well as the electronics (e.g. the linear amplifying means) in the second branch introduce some signal delay in the branches.

These signal delays will influence the operation of circuit negatively—the wider the bandwidth of the input signal, the more troublesome the influence of the signal delays. It is, therefore, common for the feed forward amplifying circuit to include signal delay compensation means for providing time alignment between the two branches. The signal delay compensation means normally includes fixed delay elements, e.g. fixed delay lines, such as transmission lines, of appropriate lengths. The fixed delay elements compensate for most of the signal delays introduced by the electronics, but usually there are some remaining signal delay differences between the two branches which must-also be compensated for, especially in wide-bandwidth operation. This additional "fine tuning" of the signal delay compensation is traditionally performed by a testing procedure where different lengths of coax interconnection cables are tried in the feed forward amplifying circuit until an acceptable signal delay compensation is achieved. There are, however, some disadvantages with this approach. First there is the logistic issue, since a large number of different cable assemblies are necessary in order to cover delay spread. Furthermore, the coax cables have to be changed manually when the signal delay compensation of the feed forward amplifying circuit is tuned. This of course incurs increased costs. The testing is also interrupted when the coax cable is changed leading to increased test time. Consequently, the described approach is not fully suitable for industrial production of feed forward amplifying circuits.

SUMMARY OF THE INVENTION

The present invention addresses mainly a problem of obtaining a feed forward amplifying circuit with signal delay compensation, wherein tuning of the signal delay compensation can be performed easily, quickly and cheaply, thus making the feed forward amplifying circuit more suitable for industrial production.

The above-stated problem is solved in short with a feed forward amplifying circuit according to the following. The feed forward amplifying circuit comprises signal delay compensation means including at least one variable signal delay element. The at least one variable signal delay element includes a plurality of signal delay components and switching circuitry providing a possibility of introducing at least one signal delay components, selected from the plurality of signal delay components, into a signal delay path.

A main advantage with the invention is that tuning of the signal delay compensation becomes easy. The tuning is performed with the at least variable signal delay element. Consequently, there is no need for the costly and time consuming procedure including coax cable "swapping" as described above. The feed forward amplifying circuit according to invention is therefore more suited for production on an industrial scale.

The invention will now be described further using preferred embodiments and referring to the drawings.

PREFERRED EMBODIMENTS

Figure 1:
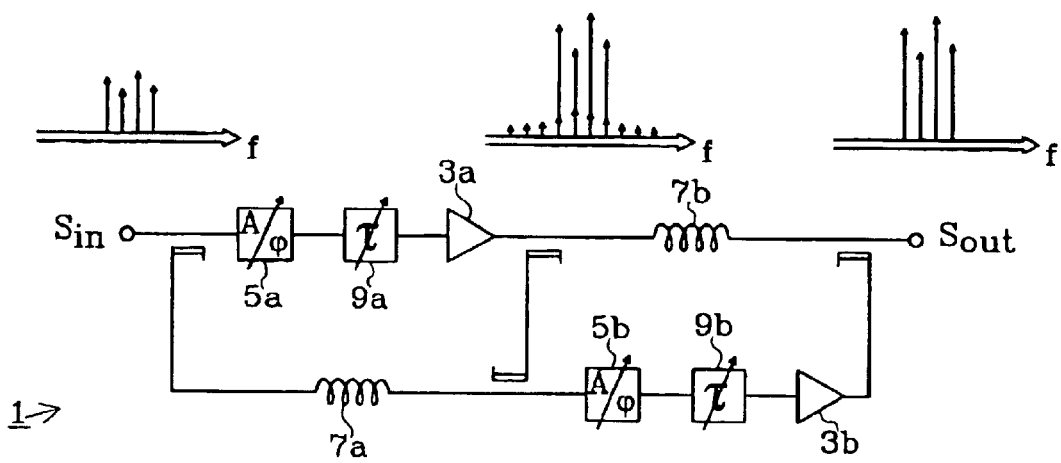
FIG. 1 is a block diagram of feed forward amplifying circuit according to a preferred embodiment of the invention.

FIG. 1 shows a block diagram of a preferred embodiment of a feed forward amplifying circuit 1 according to the present invention. The circuit 1 comprises a first (upper) branch with a main amplifier 3a operating in a non-linear mode. The circuit 1 is arranged for receiving an input signal $S_{in}$ via an input terminal. An exemplifying frequency spectrum of the input signal $S_{in}$ is depicted in FIG. 1. The circuit 1 comprises also a second (lower) branch, which is coupled to the first branch so as to receive a (small) portion of the input signal $S_{in}$, said portion forming a first reference signal which corresponds to the input signal $S_{in}$. The main amplifier 3a is arranged for amplifying the input signal $S_{in}$. A frequency spectrum of an output signal from the main amplifier is depicted in FIG. 1. As can be seen from this frequency spectrum, the output signal from the main amplifier 3a includes not only a pure linear amplification of the input signal $S_{in}$ but also distortion introduced by the non-linearity of the main amplifier 3a. The second branch is also coupled to an output of the main amplifier so as to receive a (small) portion of the output signal from the main amplifier 3a, said portion forming a second reference signal which corresponds to the output signal from the main amplifier 3a. The second branch is arranged to combine the first reference signal and the second reference signal so as to produce an error signal which is indicative of only the distortion part of the output signal from the main amplifier 3a. In this particular embodiment, a first complex gain adjuster 5a is arranged in the first branch before the main amplifier 3a. With the first complex gain adjuster 5a, an amplitude and a phase of the output signal from the main amplifier 3a can be adjusted, and as a consequence, also an amplitude and a phase of the second reference signal. By setting the first complex gain adjuster 5a appropriately, it is assured that the amplitude and the phase of second reference signal are such that the error signal only reflects the distortion part of the output signal from the main amplifier 3a and not the linear amplification part of said signal. A frequency spectrum of the error signal is depicted in FIG. 1. Of course, an amplitude of the error signal is much smaller than an amplitude of the actual distortion in the output signal from the main amplifier 3a. An (linear) error amplifier 3b is, therefore, arranged in the second branch in order to amplify the error signal. An output of the error amplifier 3b is coupled to the first branch, where the amplified error signal is combined with the output signal from the main amplifier so as to eliminate the distortion from the output signal from the main amplifier 3a. An output signal $S_{out}$ from the feed forward amplifying circuit 1 is, therefore, distortion free and can consequently be seen as linear amplification of the input signal $S_{in}$. A frequency spectrum of the output signal $S_{out}$ is depicted in FIG. 1. In this particular embodiment, a second complex gain adjuster 5b is arranged in the second branch before the error amplifier 3b. With the second complex gain adjuster 5b, an amplitude and a phase of the amplified error signal can be adjusted. By setting the second complex gain adjuster 5b appropriately, it is assured that the amplitude and the phase of the amplified error signal are such that distortion in the output signal from the main amplifier 5a is eliminated by the amplified error signal.

The electronics in the feed forward amplifying circuit 1 introduces signal delays in the branches of the feed forward amplifying circuit 1. The circuit 1, therefore, includes signal delay compensation means. In order to compensate for the signal delays introduced by the main amplifier 3a and the first complex gain adjuster 5a, the second branch includes a first fixed delay element 7a (e.g. delay line, such as coax cable, or a delaying filter) introducing a similar signal delay in the first reference signal. In addition, a first variable signal delay element 9a is arranged in the first branch before the main amplifier 3a. With the first variable signal delay element 9a, the signal delay compensation can be "fine tuned" so that time alignment between the two reference signals is achieved. In order to compensate for the signal delays introduced by the error amplifier 3b and the second complex gain adjuster 5b, a second fixed delay element (e.g. delay line, such as coax cable, or a delaying filter) is arranged in the first branch in order to introduce a similar signal delay in the output signal from the main amplifier 3a. In addition, a second variable signal delay element 9b is arranged in the second branch before the error amplifier 3b. With the second variable signal delay element 9b, the signal delay compensation can be "fine tuned" so that time alignment between the amplified error signal and the output signal from the main amplifier 3a is achieved.

Figure 2:
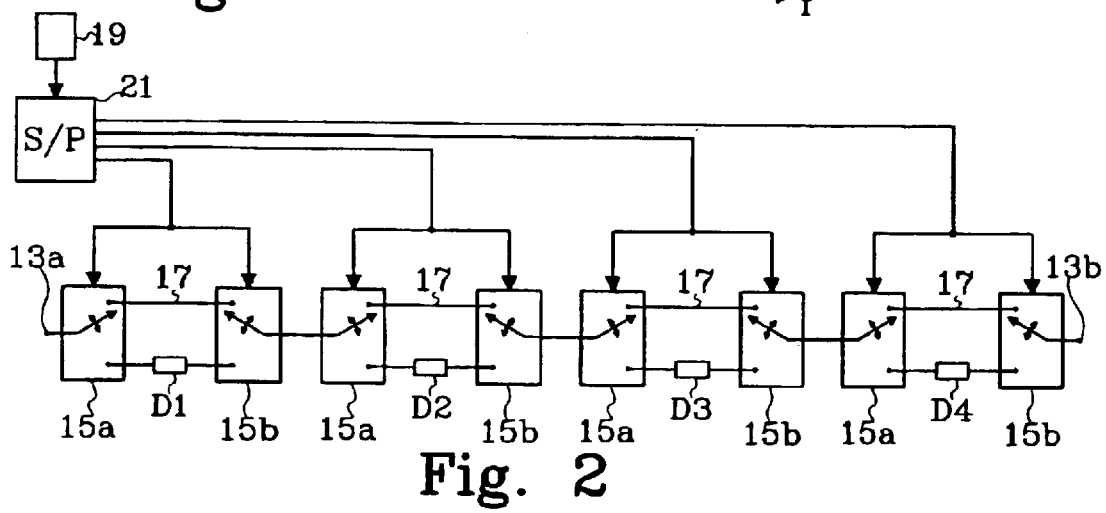
FIG. 2 is a block diagram of a preferred design of a variable signal delay element for the feed forward amplifying circuit.

FIG. 2 shows a block diagram of a preferred design of the variable signal delay elements 9a and 9b. The variable signal delay element in FIG. 2 includes four stages connected in series between a first terminal 13a and a second terminal 13b. Each stage includes a first radio frequency (RF) switch 15a and second radio frequency (RF) switch 15b. In each stage, a signal line 17 and a signal delay component Dk (k=1,2,3 or 4 depending on the stage) are arranged between the first RF switch 15a and the second RF switch 15b. The signal delay components D1–D4 are preferably signal delay lines (e.g. transmission lines of predetermined lengths) or delaying filters. The RF switches 15a and 15b are arranged so that they can set in two positions. When in the first (upper) position, the RF switches 15a and 15b connect to the signal line 17 of the stage, thereby establishing a signal connection between the RF switches 15a and 15b via the signal line 17. When the switches 15a and 15b are set in the second (lower) position, the switches 15a and 15b connect to the signal delay component Dk of the stage, thereby establishing a signal connection between the two RF switches 15a and 15b via the delay component Dk. When the RF switches 15a and 15b of one of the stages are set in the second position, the stage obtains a signal delay time which equal to $Tk+t_{Dk}$, where Tk is a signal delay time of the stage when the RF switches 15a and 15b are set in the first position and $t_{Dk}$ is an additional signal delay time, which is due mainly to the signal delay component Dk. Tk and $t_{Dk}$ need not be the same for all the stages.

Between the two terminals 13a and 13b, the variable signal delay element in FIG. 2 forms a signal delay path. By controlling the switches 15a and 15b of the stages, the delay components Dk can be selectively introduced in the signal delay path of the variable signal delay element in FIG. 2, thereby allowing a total signal delay time of the variable signal delay element to be varied.

The design illustrated in FIG. 2 is of course not limited to four stages, but can include an arbitrary N stages (N indicating a positive integer). Furthermore, it is preferred that the total signal delay time can varied with a predetermined fixed increment. The preferred way to achieve this is to select the signal delay times of the signal delay components Dk so that the total signal delay time can varied using the binary number system. This means selecting the additional signal delay times $t_{Dk}$ to form a geometric sequence having an associated ratio value of two, i-e according the following equation:

$$t_{Dk}=t_o \cdot 2^{k-1} (k=1, \ldots, N),$$

where $t_o$ is constant value.

With the this selection, it is possible to obtain a total signal delay time which is equal to $T_o+t_o \cdot L$, where $T_o$ is a constant value and L an integer value which can be arbitrarily selected in the interval $[0,2^N-1]$. Consequently, this allows the total signal delay time to be varied in increments of $t_o$ over a range which is determined by the number of stages N. Note that by adding one more stage, the number of possible total signal delay times is doubled.

For example, if, in the four stage embodiment in FIG. 2, $t_o$ is 50 ps, then the total signal delay time of the variable signal delay element can varied in increments of 50 ps in 15 steps over a 750 ps range.

The RF switches 15a and 15b are, preferably, arranged to be electrically controlled. In the particular embodiment of FIG. 2, the RF switches 15a and 15b of each stage are digitally controlled. The variable signal delay element of FIG. 2 comprises thus a control circuit 19 which is arranged for generating a digital control signal including a series of digital control bits, which indicate in what positions the RF switches 15a and 15b of the stages should be set. The control circuit 19 is connected to a S/P (serial to parallel) converter 21 which is arranged for receiving the digital control signal and for converting this signal into four parallel digital signals. The RF switches 15a and 15b of each stage are arranged for receiving a corresponding one of the parallel digital signals, which thus provide individual control of the RF switches 15a and 15b of each stage. The RF switches 15a and 15b of the stages can, of course, be controlled in many other ways as well. For example, the control circuit is alternatively arranged for generating the four parallel digital signals directly without the use of the S/P converter 21.

Figure 3:
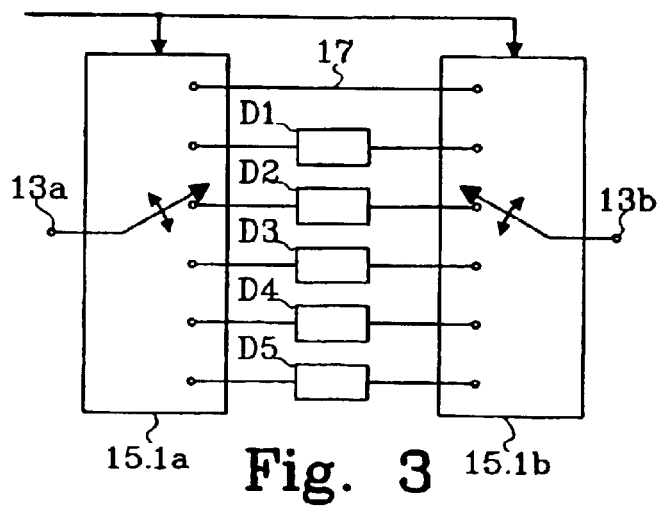
FIG. 3 is a block diagram of another preferred design of a variable signal delay element for the feed forward amplifying circuit.

In the embodiment of FIG. 2, each stage includes only one signal delay component. Alternatively, however, it is possible to have more than one signal delay component in a stage. In FIG. 3 is shown block diagram of yet another preferred design of the variable signal delay elements 9a and 9b. The variable delay element in FIG. 3 includes one stage with a first RF switch 15.1a and a second RF switch 15.1b. A signal line 17 and, in this particular example, five signal delay components D1–D5. The RF switches 15.1a and 15.1b are arranged so that they can be selectively set in six positions, thereby selectively establishing a signal connection between the RF switches via the signal line 17 or any one of the signal delay components D1–D5. The RF switches 15.1a and 15.1b are electrically controlled with a control signal generated by a control circuit (not shown).

If the additional signal delay times of the signal delay components (D1–D5) in the embodiment of FIG. 3 form an arithmetic sequence, then the total signal delay time can be varied in predetermined fixed increments.

However, it is also possible to combine several (N) stages which each include a plurality (M) of signal delay components and to provide variation in predetermined fixed increments of the total signal delay time using a number system other than the binary system, i.e. a number system using the base M+1. With $t_{D(j,k)}$ denoting the additional signal delay time associated with the signal delay component number j in stage number k, the additional signal delay times are then selected according to the following equation:

$$t_{D(j,k)} = t_o \cdot j \cdot (M+1)^{k-1} (j=1, \ldots, M-1; k=1, \ldots, N),$$

where $t_o$ is a constant value. This allows the total signal delay time of the variable signal delay element to be varied in increments of $t_o$ over a range having width of $t_o \cdot (M^N - 1)$.

For example, if the decimal number system is used (base ten), then each stage includes nine signal delay components and the additional signal delay times increase with a factor ten for each stage.

The tuning of the signal delay compensation of the feed forward amplifying circuit 1 is performed easily with the variable signal delay elements 9a and 9b. There is no need for the costly and time consuming procedure of changing coax cables. Furthermore, when the variable signal delay elements 9a and 9b are electrically controlled, the tuning of the feed forward amplifying circuit 1 can be fully automated.

The feed forward amplifying circuit 1 is thus very suitable for industrial production.

What is claimed is:

1. A feed forward amplifying circuit comprising signal delay compensation means, characterised in that the signal delay compensation means includes at least one variable signal delay element including:

a plurality of signal delay components; and switching circuitry providing a possibility of introducing at least one signal delay component, selected from said plurality of signal delay components, in a signal delay path.

2. A feed forward amplifying circuit according to claim 1, wherein the variable signal delay element includes at least one stage including:

a first and a second switch; and a reference signal line, and wherein the two switches of the stage are arranged so that they can be selectively set in positions where signal connections are established between the two switches via the reference signal line or at least one signal delay component from the plurality of signal delay components.

3. A feed forward amplifying circuit to claim 1, wherein the signal delay components and the switching circuitry are adopted so that a total signal delay time of the variable signal delay element can be varied according to a predetermined number system.

4. A feed forward amplifying circuit according to claim 3, wherein the number system is the binary system.

5. A feed forward amplifying circuit according to claim 3, wherein the number system is the decimal system.

6. A feed forward amplifying circuit according to claim 1, wherein at least one of the delay components is a delay line.

7. A feed forward amplifying circuit according to claim 6, wherein at least one of the signal delay components is a transmission line.

8. A feed forward amplifying circuit according to claim 1, wherein at least one of the signal delay components is a delaying filter.

9. A feed forward amplifying circuit according to claim 1, wherein the variable signal delay element is arranged in the feed forward amplifying circuit for providing signal delay compensation with respect to signal delay introduced at least in part by a main amplifier.

10. A feed forward amplifying circuit according to claim 1, wherein the variable signal delay element is arranged in the feed forward amplifying circuit for providing signal delay compensation with respect to signal delay introduced at least in part by an error amplifier.

11. A feed forward amplifying circuit according to claim 1, wherein the feed forward amplifying circuit comprises at least one fixed signal delay element.

* * * * *